US012283932B2

United States Patent
Bao et al.

(10) Patent No.: US 12,283,932 B2
(45) Date of Patent: Apr. 22, 2025

(54) METHOD, SYSTEM AND STORAGE MEDIUM OF PROPORTIONAL-INTEGRAL-DERIVATIVE BASED AUTOMATIC GAIN CONTROL FOR SATELLITE TRANSPONDER SYSTEM UNDER PARTIAL-TIME PARTIAL-BAND ADDITIVE WHITE GAUSSIAN NOISE JAMMING

(71) Applicant: Intelligent Fusion Technology, Inc., Germantown, MD (US)

(72) Inventors: Yajie Bao, Germantown, MD (US); Peng Cheng, Germantown, MD (US); Khanh Pham, Kirtland AFB, NM (US); Erik Blasch, Arlington, VA (US); Dan Shen, Germantown, MD (US); Xin Tian, Germantown, MD (US); Genshe Chen, Germantown, MD (US)

(73) Assignee: Intelligent Fusion Technology, Inc., Germantown, MD (US)

( * ) Notice: Subject to any disclaimer, the term of this patent is extended or adjusted under 35 U.S.C. 154(b) by 34 days.

(21) Appl. No.: 18/467,808

(22) Filed: Sep. 15, 2023

(65) Prior Publication Data

US 2025/0096761 A1    Mar. 20, 2025

(51) Int. Cl.
*H03G 3/30* (2006.01)

(52) U.S. Cl.
CPC ......... *H03G 3/3068* (2013.01); *H03G 3/3078* (2013.01)

(58) Field of Classification Search
CPC ... H03G 3/3068; H03G 3/3078; H03G 3/3089
USPC ........................................................ 375/345
See application file for complete search history.

(56) References Cited

U.S. PATENT DOCUMENTS

2022/0029594 A1*  1/2022  Xiang .................. H03G 3/3089

\* cited by examiner

*Primary Examiner* — Leila Malek
(74) *Attorney, Agent, or Firm* — ANOVA LAW GROUP, PLLC

(57) ABSTRACT

The present disclosure provides a method, a system and a storage medium of PID-based automatic gain control for a satellite transponder system. The method includes receiving a sequence of sample signals; determining two different block sizes where a block size of a first block is greater than a block size of a second block; using the block size of the first block to compute a first signal-amplitude-ratio (SAR)-based gain value and using the block size of the second block to compute a second signal-amplitude-ratio (SAR)-based gain value by the AGC processor through the sequence of sample signals; calculating a to-be-applied gain control value of an m-th transmitted symbol at a n-th time step; and calculating a new AGC gain at the n-th time step according to the to-be-applied gain control value at the n-th time step and a corresponding AGC gain at the (n−1)-th time step.

18 Claims, 7 Drawing Sheets

METHOD, SYSTEM AND STORAGE MEDIUM OF PROPORTIONAL-INTEGRAL-DERIVATIVE BASED AUTOMATIC GAIN CONTROL FOR SATELLITE TRANSPONDER SYSTEM UNDER PARTIAL-TIME PARTIAL-BAND ADDITIVE WHITE GAUSSIAN NOISE JAMMING

GOVERNMENT RIGHTS

The present disclosure was made with Government support under Contract No. FA9453-21-C-0556, awarded by the United States Air Force Research Laboratory. The U.S. Government has certain rights in the present disclosure.

FIELD OF THE DISCLOSURE

The present disclosure generally relates to the field of satellite communication technology and, more particularly, relates to a method, a system and a storage medium of proportional-integral-derivative (PID) based automatic gain control (AGC) for a satellite transponder system under partial-time partial-band additive white Gaussian noise (AWGN) jamming.

BACKGROUND

AGC has been used in current satellite transponder to maintain a to-be-applied signal amplitude, extend a dynamic range by preventing quantization error or saturation at an analog-to-digital converter (ADC), and maintain gain of a high-power amplifier (HPA) to avoid operating at saturation. However, conventional AGC scheme (e.g., solution or method) that uses a predefined look-up table (LUT) may only perform well in specified environments with small fluctuations of the input signal amplitude. In the case of partial-time partial-band AWGN jamming, a frequency hopping algorithm is applied for anti-jamming, and a signal carrier frequency rapidly hops among various distinct frequencies occupying a large spectral band, which further increases the uncertainty of amplitude fluctuations caused by jamming signals and channel noise. Therefore, a transponder's front-end AGC is needed for fast response to large amplitude variations without overreacting to the noise and jamming, such that an inter-modulation (IM) level at the output of the HPA is at an "acceptable" level, and link performance is enhanced in the presence of smart jammers and non-linearity of satellite HPA.

Jamming mitigation for SATCOM has been the subject of various research using different approaches such as game theory, frequency hopping, wave selection, power allocation, and systems-level analysis. These approaches are typically developed for near-real-time data-driven approaches with limited predictive analysis. The power selection is developed in the presence of jamming using active control.

Signal amplitude ratio (SAR) is used as a gain control value when the SAR is greater than maximum control capacity of conventional AGC. Using the SAR may produce a fast response to significant change of the average of received sample signals normalized by AGC gain in adjacent blocks. However, the SAR-based AGC scheme may compute the gain control value to-be-applied for current sample signal based on tracking errors at previous time instant rather than anticipating future events and taking control actions accordingly, which may not provide satisfied control performance in future time instants.

BRIEF SUMMARY OF THE DISCLOSURE

One aspect of the present disclosure provides a method of PID-based automatic gain control for a satellite transponder system under partial-time partial-band additive white Gaussian noise (AWGN) jamming. The method includes receiving a sequence of sample signals by a AGC processor after an analog-digital-converter (ADC) in the satellite transponder system; determining two different block sizes from the sequence of sample signals where a block size of a first block of sample signals is greater than a block size of a second block of sample signals; using the block size of the first block to compute a first signal-amplitude-ratio (SAR)-based gain value and using the block size of the second block to compute a second signal-amplitude-ratio (SAR)-based gain value by the AGC processor through the sequence of sample signals; and if the first SAR-based gain value is greater than an amplitude threshold, calculating a to-be-applied gain control value of an m-th transmitted symbol at a n-th time step using the second SAR-based gain value, a tracking error at a (n−1)-th time step, a summation of a plurality of tracking errors from a 1-st time step to the (n−1)-th time step, and a tracking error difference between the tracking error at the (n−1)-th time step and a tracking error at a (n−2)-th time step; or if the first SAR-based gain value is equal to or less than the amplitude threshold, calculating a to-be-applied gain control value of an m-th transmitted symbol at a n-th time step using a minimum difference between an estimated amplitude and each of reference amplitudes in a lookup table (LUT), and the tracking error difference between the tracking error at a (n−1)-th time step and the tracking error at a (n−2)-th time step.

Another aspect of the present disclosure provides a system. The system includes a memory, configured to store program instructions for performing a method of PID-based automatic gain control for a satellite transponder system under partial-time partial-band AWGN jamming; and a processor, coupled with the memory and, when executing the program instructions, configured for: receiving a sequence of sample signals by a AGC processor after an analog-digital-converter (ADC) in the satellite transponder system; determining two different block sizes from the sequence of sample signals where a block size of a first block of sample signals is greater than a block size of a second block of sample signals; using the block size of the first block to compute a first signal-amplitude-ratio (SAR)-based gain value and using the block size of the second block to compute a second signal-amplitude-ratio (SAR)-based gain value by the AGC processor through the sequence of sample signals; and if the first SAR-based gain value is greater than an amplitude threshold, calculating a to-be-applied gain control value of an m-th transmitted symbol at a n-th time step using the second SAR-based gain value, a tracking error at a (n−1)-th time step, a summation of a plurality of tracking errors from a 1-st time step to the (n−1)-th time step, and a tracking error difference between the tracking error at the (n−1)-th time step and a tracking error at a (n−2)-th time step; or if the first SAR-based gain value is equal to or less than the amplitude threshold, calculating a to-be-applied gain control value of an m-th transmitted symbol at a n-th time step using a minimum difference between an estimated amplitude and each of reference amplitudes in a lookup table (LUT), and the tracking error difference between the tracking error at a (n−1)-th time step and the tracking error at a (n−2)-th time step.

Another aspect of the present disclosure provides a non-transitory computer-readable storage medium, containing program instructions for, when being executed by a processor, performing a method of PID-based automatic gain control for a satellite transponder system under partial-time partial-band AWGN jamming. The method includes receiving a sequence of sample signals by a AGC processor after an analog-digital-converter (ADC) in the satellite transponder system; determining two different block sizes from the sequence of sample signals where a block size of a first block of sample signals is greater than a block size of a second block of sample signals; using the block size of the first block to compute a first signal-amplitude-ratio (SAR)-based gain value and using the block size of the second block to compute a second signal-amplitude-ratio (SAR)-based gain value by the AGC processor through the sequence of sample signals; and if the first SAR-based gain value is greater than an amplitude threshold, calculating a to-be-applied gain control value of an m-th transmitted symbol at a n-th time step using the second SAR-based gain value, a tracking error at a (n−1)-th time step, a summation of a plurality of tracking errors from a 1-st time step to the (n−1)-th time step, and a tracking error difference between the tracking error at the (n−1)-th time step and a tracking error at a (n−2)-th time step; or if the first SAR-based gain value is equal to or less than the amplitude threshold, calculating a to-be-applied gain control value of an m-th transmitted symbol at a n-th time step using a minimum difference between an estimated amplitude and each of reference amplitudes in a lookup table (LUT), and the tracking error difference between the tracking error at a (n−1)-th time step and a tracking error at a (n−2)-th time step.

Other aspects of the present disclosure may be understood by those skilled in the art in light of the description, the claims, and the drawings of the present disclosure.

BRIEF DESCRIPTION OF THE DRAWINGS

The accompanying drawings, which are incorporated into a part of the specification, illustrate embodiments of the present disclosure and together with the description to explain the principles of the present disclosure.

DETAILED DESCRIPTION

References may be made in detail to exemplary embodiments of the disclosure, which may be illustrated in the accompanying drawings. Wherever possible, same reference numbers may be used throughout the accompanying drawings to refer to same or similar parts.

Figure 1:
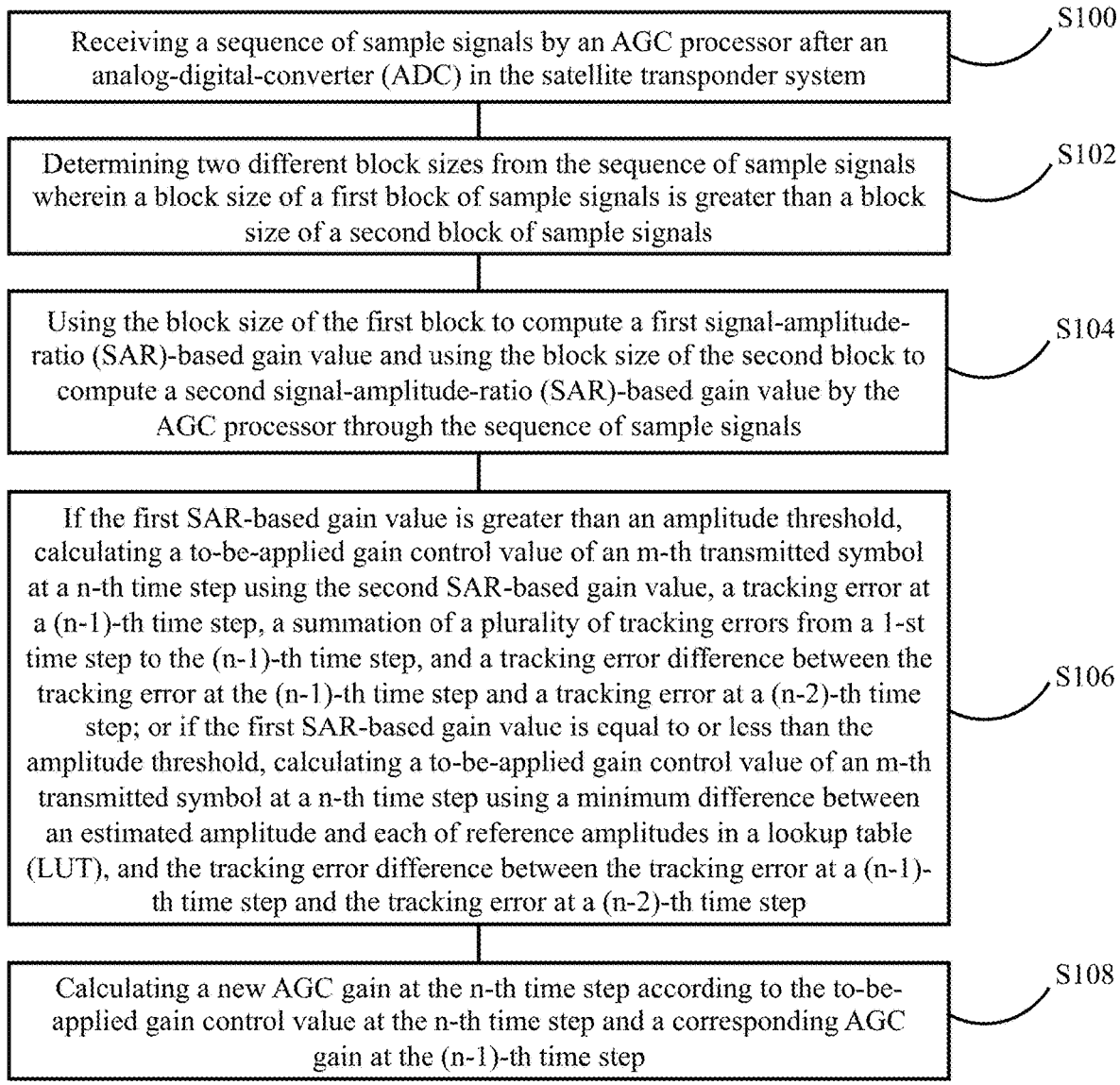
FIG. 1 depicts an exemplary method of proportional-integral-derivative (PID) based automatic gain control for a satellite transponder system under partial-time partial-band additive white Gaussian noise (AWGN) jamming according to various disclosed embodiments of the present disclosure.

According to various embodiments of the present disclosure, a method of PID-based automatic gain control (AGC) for a satellite transponder system under partial-time partial-band additive white Gaussian noise (AWGN) jamming is described hereinafter. Referring to FIG. 1, FIG. 1 depicts an exemplary method of proportional-integral-derivative (PID) based automatic gain control for the satellite transponder system under partial-time partial-band AWGN jamming according to various disclosed embodiments of the present disclosure.

At S100, a sequence of sample signals is received by an AGC processor after an analog-digital-converter (ADC) in the satellite transponder system.

At S102, two different block sizes are determined from the sequence of sample signals where a block size of a first block of sample signals is greater than a block size of a second block of sample signals.

At S104, the block size of the first block is used to compute a first signal-amplitude-ratio (SAR)-based gain value, and the block size of the second block is used to compute a second signal-amplitude-ratio (SAR)-based gain value by the AGC processor through the sequence of sample signals.

At S106, if the first SAR-based gain value is greater than an amplitude threshold, a to-be-applied gain control value of an m-th transmitted symbol at a n-th time step is calculated using the second SAR-based gain value, a tracking error at a (n−1)-th time step, a summation of a plurality of tracking errors from a 1-st time step to the (n−1)-th time step, and a tracking error difference between the tracking error at the (n−1)-th time step and a tracking error at a (n−2)-th time step; or if the first SAR-based gain value is equal to or less than the amplitude threshold, a to-be-applied gain control value of an m-th transmitted symbol at a n-th time step is calculated using a minimum difference between an estimated amplitude and each of reference amplitudes in a lookup table (LUT), and the tracking error difference between the tracking error at a (n−1)-th time step and the tracking error at a (n−2)-th time step.

At S108, a new AGC gain at the n-th time step is calculated according to the to-be-applied gain control value at the n-th time step and a corresponding AGC gain at the (n−1)-th time step.

In one embodiment, if an absolute value of a difference between the first SAR-based gain value and the second SAR-based gain value is equal to or greater than a predefined step size, the second SAR-based gain value is used for computing the to-be-applied gain control value.

In one embodiment, if an absolute value of a difference between the first SAR-based gain value and the second SAR-based gain value is less than a predefined step size, the first SAR-based gain value is used for computing the to-be-applied gain control value.

In one embodiment, the to-be-applied gain control value is calculated as:

$$S_{m,n} = \begin{cases} S_p^{fast} + K_P \cdot e_{m,n-1} + K_I \cdot \sum_{i=1}^{n-1} e_{m,i} + K_D \cdot \Delta e_{m,n-1}, & \text{if } |S_p^{slow}| > \gamma; \\ S_{i*} + K'_D \cdot \Delta e_{m,n-1}, & \text{otherwise} \end{cases}$$

where $S_{m,n}$ denotes the to-be-applied gain control value of the m-th transmitted symbol at the n-th time step, i denotes a reference amplitude, $K_p$ denotes a proportional term, $K_I$ denotes an integral term, $K_D$ and $K'_D$ denote derivative terms, $S_p^{slow}$ denotes the first SAR-based gain value, $S_p^{fast}$ denotes the second SAR-based gain value, e denotes a tracking error, $\Delta e_{m,n-1} = e_{m,n-1} - e_{m,n-2}$, and $S_{i*}$ denotes the minimum difference between the estimated amplitude and each of reference amplitudes in the LUT.

In one embodiment, the first SAR-based gain value and the second SAR-based gain value are calculated through a normalized signal amplitude ratio calculator.

The problem of maintaining a to-be-applied signal amplitude under AWGN jamming may be formulated as a stochastic model predictive control (SMPC) problem to minimize the signal amplitude tracking error after applying the AGC gain. Based on the analysis, SAR and PID control may be combined to improve the performance of AGC. Furthermore, a large block size may be used to compute the SAR for determining whether to use SAR as the control gain value or a small block size to respond fast to the latest changes of signals with a frequency that is robust to noise.

Figure 2:
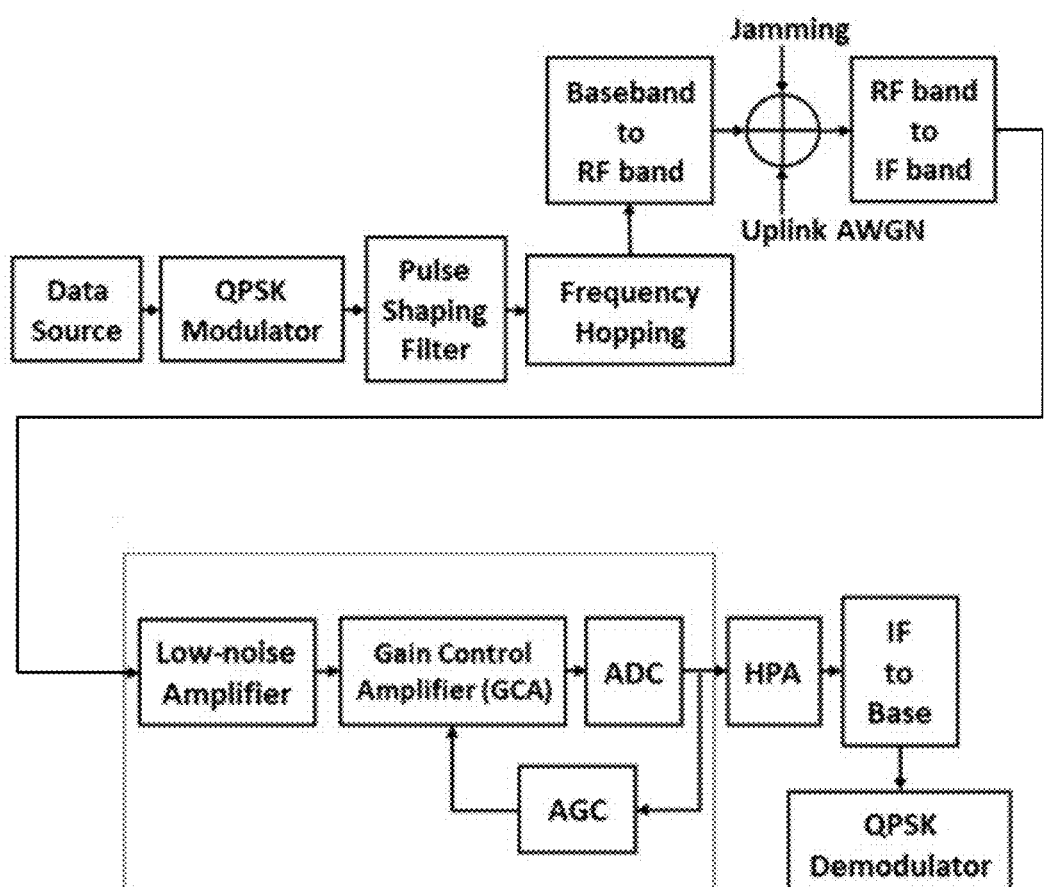
FIG. 2 depicts an exemplary structure of a simplified satellite transponder model according to various disclosed embodiments of the present disclosure.

FIG. 2 depicts an exemplary structure of a simplified satellite transponder model according to various disclosed embodiments of the present disclosure. In the satellite transponder architecture, the following components are essential for functioning of the satellite transponder. The satellite transponder may have one or more antennas to receive and transmit electromagnetic signals. A receiving antenna may capture the signals from an earth station, while a transmitting antenna may send amplified signals back to a target location on the Earth. Low noise amplifier (LNA) is a critical component in the receiver chain and may amplify weak incoming signals from the earth station while adding minimal noise to maintain signal quality. A downconverter may convert received signals back to an original frequency band before demodulation and decoding by a signal processor. An analog-to-digital converter (ADC) may convert an analog signal to a digital signal for further signal processing. Digitized signal data may be processed using an onboard signal processor, which includes implementation of a smart AGC. A digital-to-analog converter (DAC) may convert a baseband digital signal to an analog signal for further signal transmission. An upconverter may raise the frequency of a modulated signal to to-be-applied transmission frequency, allowing to-be-applied transmission frequency to be transmitted through the satellite's transmitting antenna. A high power amplifier (HPA) may be responsible for boosting signal strength before retransmission, which may increase the signal power to a level suitable for efficient transmission over long distance to the target location. It should be noted that other components in the satellite transponder may refer to same or similar components in the existing technology.

Referring to FIG. 2, the transponder may convert uplink carrier frequencies to downlink carrier frequencies for information transmission without onboard processing capabilities, where RF band denotes radio frequency band. Furthermore, signals in the transponder may be in the intermediate frequency (IF) band; that is, the shifted carrier may be used as an intermediate step in transmission. It should be noted that the HPA in the transponder can cause nonlinear distortions to the transmitted signals and normally operate at or close to its saturation point (i.e., the maximum output power capacity) to maximize power efficiency. AGC may control the gain controller amplifier (GCA) gain following the low-noise amplifier (LNA) to maintain a to-be-applied signal amplitude which facilitates HPA to correct phase shifts. Therefore, the control performance may affect the BER (bit error rate) performance.

Conventional AGC may compare the average amplitude $A_{m,n}$ with the to-be-applied amplitude $A_{des}$ (e.g., desired amplitude) to determine the gain control value. In particular, $A_{m,n}$ may be estimated by:

$$A_{m,n} = (1-\lambda)A_{m,n-1} + \lambda|\hat{y}_{m,n}| \quad (1)$$

where $\hat{y}_{m,n}$ denotes the received sample signal of the m-th transmitted symbol at the n-th time instant after ADC operation; $\lambda = 2^{-L}$ with L denoting a tuning parameter that controls the trade-off between estimation complexity and performance. Then, conventional AGC may determine the gain control value as $S_{m,n} = S_{i*}$, where $S_{i*} = \min_i |A_{m,n} - A_{des,i}|$, and $A_{des,i}$ is the i-th reference amplitude from a discrete set of reference amplitudes in the predefined LUT with associated $S_i$. Increasing $S_i$ may decrease the response time for large input signal power variations, but also increase the variation of the output signal power level during the steady-state operation. Finally, the AGC gain $G_{m,n}^{AGC}$ may be calculated by:

$$G_{m,n}^{AGC} = G_{m,n-1}^{AGC} + S_{m,n} \quad (2)$$

where both $G_{m,n}^{AGC}$ and $S_{m,n}$ are scalars; and the subscripts m and n denote the m-th symbol and n-th time instant.

The hybrid gamma parameter may be developed to enhance the performance of conventional AGC in case of large signal-level difference but used a heuristic parameter-changing-point, which is not practical in implementation.

Instead, in order to improve the response time while maintaining a small variation of the output signal amplitude of conventional AGC scheme (e.g., solution or method), a fast AGC scheme may be developed based on the SAR defined as:

$$S_p = \sum_{i=1}^{\beta} \left|\frac{\hat{y}_{m,n-\beta-i}}{G_{m,n-\beta-i}^{AGC}}\right| / \sum_{i=1}^{\beta} \left|\frac{\hat{y}_{m,n-i}}{G_{m,n-i}^{AGC}}\right| \quad (3)$$

where $\beta = \lambda^{-1} = 2^L$ denotes a block size. The division in (3) may be to avoid the effects of AGC on computing SAR.

Figure 3:
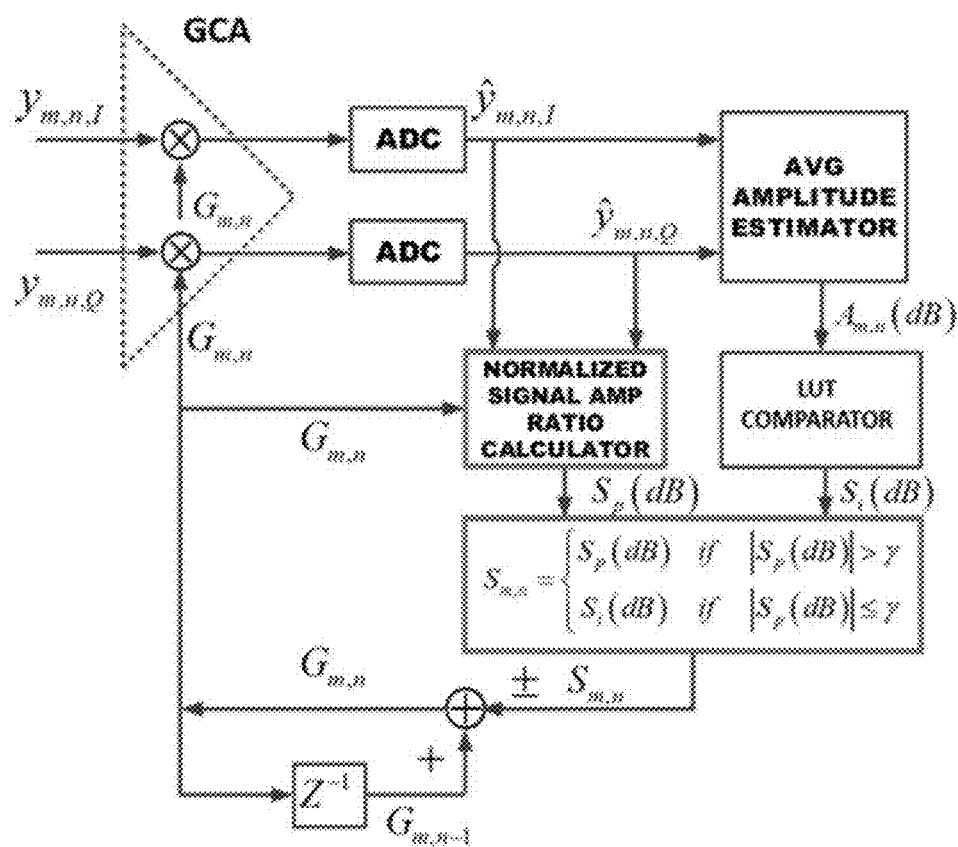
FIG. 3 depicts an exemplary feedback AGC block diagram according to various disclosed embodiments of the present disclosure.

Then, the control law may be given as:

$$S_{m,n} = \begin{cases} S_p, & |S_p| > \gamma \\ S_{i^*}, & |S_p| \leq \gamma \end{cases} \quad (4)$$

where $\gamma = \max_i(A_{des,i} - A_{des})$. In such way, a larger step size $S_p \geq S_{i^*}$ may be provided when the signal has larger amplitude fluctuation than a threshold $\gamma$ (maximum control capability of conventional AGC). FIG. 3 depicts an exemplary overall feedback AGC block diagram according to various disclosed embodiments of the present disclosure. Furthermore, the AGC parameters such as L and $S_i$ may be determined by trial and error using simulations.

Moreover, the SAR and the signal amplitude tracking errors may be combined as the gain control value, which can be viewed as proportional control with time-varying gains. However, using proportional control alone may result in an error between the set point and the process value (i.e., offset) as the controller needs an error to generate the proportional output response.

According to various embodiments of the present disclosure, AGC under AWGN jamming is described hereinafter. The problem of AGC may be analyzed from the perspective of SMPC, and the PID-based AGC scheme may be provided in embodiments of the present disclosure.

The objective of AGC may be to minimize the signal amplitude tracking errors during the signal transmission as the following:

$$\min_{G_{m,1}^{AGC},\ldots,G_{m,N}^{AGC}} \sum_{n=1}^{N} \mathbb{E}\left[\left\|20\log_{10}\hat{A}_{m,n} - A_{des}\right\|_p^p \mid S_{m,n-1}\right]$$

where $\|\ \|_p^p$ denotes the usual p-norm with $p \geq 1$ and $p=1$ (i.e., mean absolute error (MAE) is used to measure the tracking error; $\hat{A}_{m,n}$ is the estimated average amplitude at time instant n, $n=1, 2, \ldots, N$; $S_{m,n-1}=\{s_{m,0},\ldots,s_{m,n-1}\}$ is all historic observations up till time instant n with $s_{m,n}$ denoting the n-th time-domain sample for the m-th symbol. The analysis of one-step-ahead predictions is started. For example, in one embodiment, the problem of AGC under jamming at time instant n may be formulated as:

$$\min_{G_{m,n}^{AGC}} \mathbb{E}\left[\left\|20\log_{10}\hat{A}_{m,n} - A_{des}\right\|_p^p \mid S_{m,n-1}\right] \quad (5a)$$

$$\text{s.t. } A_{m,n} = (1-\lambda)A_{m,n-1} + \lambda|\hat{y}_{m,n}| \quad (5b)$$

$$\hat{y}_{m,n} = |s_{m,n}| 10^{\frac{G^{LNA} + \underline{G}^{GCA} + G_{m,n}^{AGCC}}{20}} \quad (5c)$$

$$s_{m,n} = \begin{cases} x_{m,n} + \omega_{m,n} + \upsilon_{m,n}, & \text{if } n \in I_{Jam}; \\ x_{m,n} + \omega_{m,n}, & \text{otherwise} \end{cases} \quad (5d)$$

$$0 \leq G_{m,n}^{AGC} \leq \overline{G}^{GCA} \quad (5e)$$

where $\omega_{m,n}$ denotes the noise caused by multi-path fading and signal interference while $\upsilon_n$ represents the jamming signal with $I_{Jam}$ denoting the set of time instants when jamming happens; and $\overline{G}^{GCA}$ and $\underline{G}^{GCA}$ denote the upper and lower bounds of the GCA gain, respectively. Gains may be processed from the low-noise amplifier $G^{LNA}$, automatic gain control $G_{m,n}^{AGC}$, and gain controller amplifier $G^{GCA}$. Given $s_{m,n}$, the optimal gain may be calculated in following equation (6):

$$G_{m,n^*}^{AGC}(s_{m,n}) = 20\log_{10}\frac{10^{\frac{A_{des}}{20}} - (1-\lambda)A_{m,n-1}}{\lambda|s_{m,n}|} - G^{LNA} - \underline{G}^{GCA} \quad (6)$$

Since v is assumed to be white Gaussian noise, the value of $\upsilon_{m,n}$ is unknown before the realization of the noise. Therefore, the performance of $G^{AGC}$ may depend on the accuracy of the estimation of $s_{m,n}$. However, when $s_{m,n}$ is a random variable, it is convenient to show that the minimizer of the optimization problem (5) is shown as following equation (7):

$$G_{m,n^*}^{AGC} = \mathbb{E}\left[G_{m,n^*}^{AGE}(s_{m,n}) \mid S_{m,n-1}\right] \quad (7)$$

It should be noted that conventional AGC may use a LUT to determine the gain control value $S_{m,n}$ based on the signal amplitude tracking error $e_{m,n-1} := A_{m,n-1}(\omega_{m,n-1}, \upsilon_{m,n-1}) - A_{des}$ (i.e., the difference between estimated amplitude and to-be-applied or desired amplitude), which may cause the slow response to the signal amplitude variations. To quickly reflect the variation of the received signal, the AGC gain may be adjusted based on the comparison between the signal amplitude ratio and the maximum control capacity of the AGC. However, the SAR-based AGC (SAR-AGC) approach may result in large tracking errors in the following time instants without considering the future trend of the signal amplitude tracking error.

Assuming no model of $s_{m,n}$ to improve the control performance, in embodiments of the present disclosure, proportional, derivative and/or integral terms to the gain control values $S_{m,n}$ may be further provided as follows:

$$S_{m,n} = \begin{cases} S_p^{fast} + K_P \cdot e_{m,n-1} + K_I \cdot \sum_{i=1}^{n-1} e_{m,i} + K_D \cdot \Delta e_{m,n-1}, & \text{if } |S_p^{slow}| > \gamma; \\ S_{i^*} + K_D' \cdot \Delta e_{m,n-1}, & \text{otherwise} \end{cases} \quad (8)$$

where $K_P$, $K_I$, $K_D$, and $K_D'$ are tuning parameters of the terms; $\Delta e_{m,n-1} = e_{m,n-1} - e_{m,n-2}$; $S_p^{fast}$ is a SAR computed by equation (3) using a small B while $S_p^{slow}$ using a large B; and $B = \lambda^{-1} = 2^L$ is the block size. $K_P$ denotes a proportional term; $K_I$ denotes an integral term; and $K_D$ and $K_D'$ denote derivative terms. A smaller B may reduce the computational complexity but also increase the sensitivity to noise and jamming while a larger B may slow down the response to the amplitude fluctuations. Therefore, different block sizes may be used to achieve a desirable tradeoff between estimation stability and fast response. Moreover, $S_p^{fast}$ may be used only when $|S_p^{fast} - S_p^{slow}| > \gamma_{step}$ with $\gamma_{step}$ denoting a predefined step size; otherwise, $S_p^{fast} = S_p^{slow}$, as $S_p^{slow}$ does not make a significant difference. The derivative term ($K_D$) may use current rate of change of errors as the best estimate of the future trend to exert a control influence and give a faster response while the integral term $K_I$ may eliminate the steady-state errors. The developed PID-based AGC may only slightly increase the computational cost of the SAR-based AGC by computing an additional SAR and the PID terms.

In the present disclosure, the PID-based AGC scheme may be validated using simulations of a satellite transponder model equipped with HPAs under different noise and jamming levels. Furthermore, the HPA model may be provided based on the extended Saleh's model. The simulation parameters are summarized in Table 1.

TABLE 1

| Baseband Signal | | IF Band Signal | |
|---|---|---|---|
| Bit Rate | 20 MHz | Center Frequency | 100 MHZ |
| Modulation | QPSK | Sampling Rate | 400 MHZ |
| Symbol Rate | 10 MHz | | |

Figure 4:
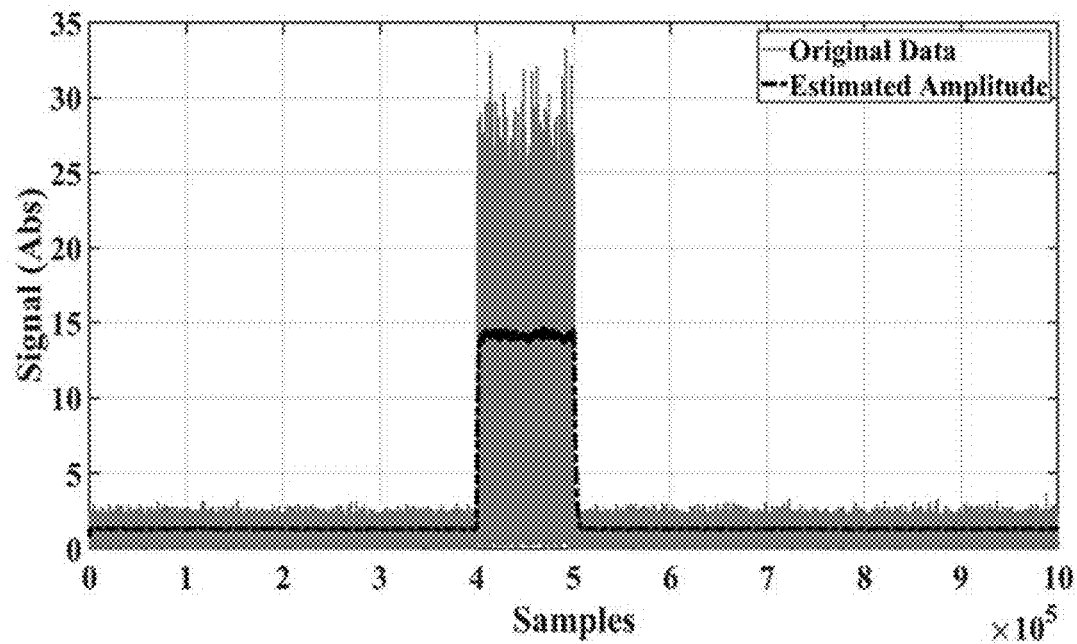
FIG. 4 depicts an exemplary jammed signal with estimated amplitudes when $Eb/NO_{Jam}=-20$ dB for a jamming signal according to various disclosed embodiments of the present disclosure.

In addition to the channel noise, it may further add AWGN jamming with energy per bit to noise power spectral density ratio $Eb/No_{Jam}=-20$ dB. FIG. 4 depicts an exemplary jammed signal with estimated amplitudes when $Eb/No_{Jam}=-20$ dB for a jamming signal according to various disclosed embodiments of the present disclosure.

The jamming started at the sample #400048 and ended at #500168. Referring to FIG. 4, the signal amplitude may increase significantly when jamming occur, which may decrease BER by degrading the performance of HPA. Furthermore, the to-be-applied input signal amplitude for HPA may be $A_{des}=-7$ dBm based on the property of HPA for simulation, which is at −3 dB of the HPA's saturation point.

Figure 5:
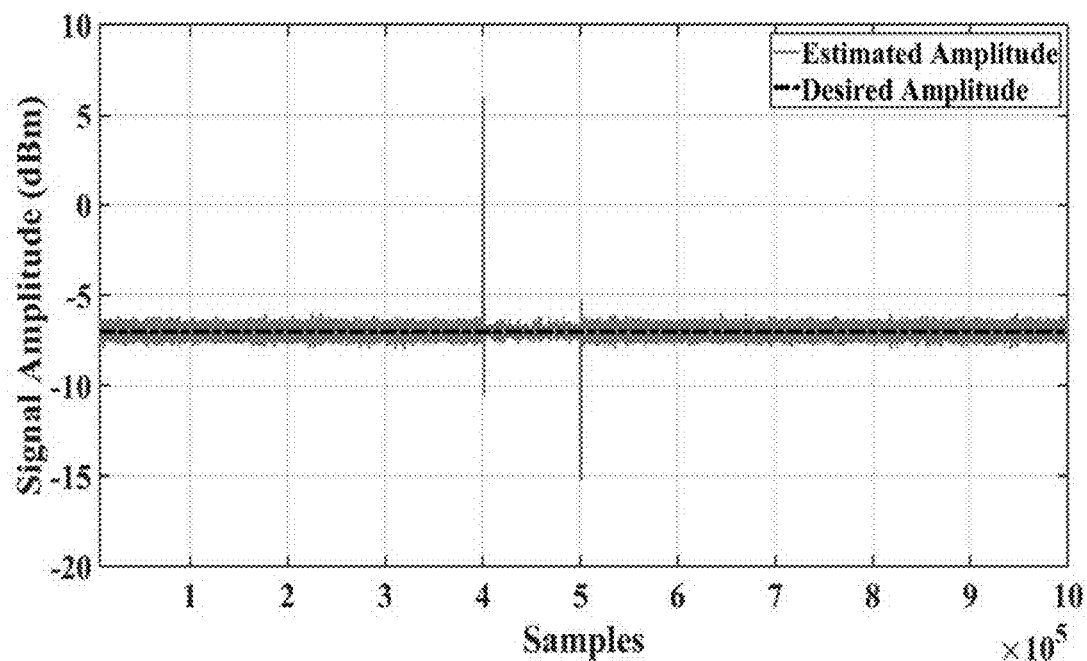
FIG. 5 depicts an exemplary schematic of signal amplitudes using AGC according to various disclosed embodiments of the present disclosure.
Figure 6A:
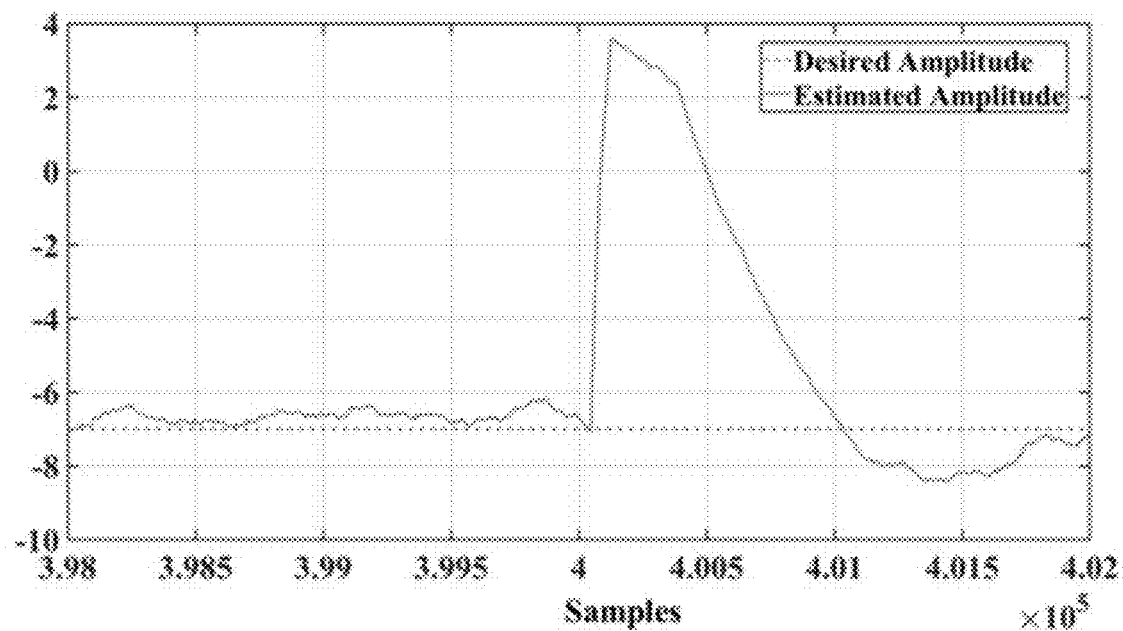
FIG. 6A depicts an exemplary schematic of signal amplitudes using AGC when jamming is started according to various disclosed embodiments of the present disclosure.
Figure 6B:
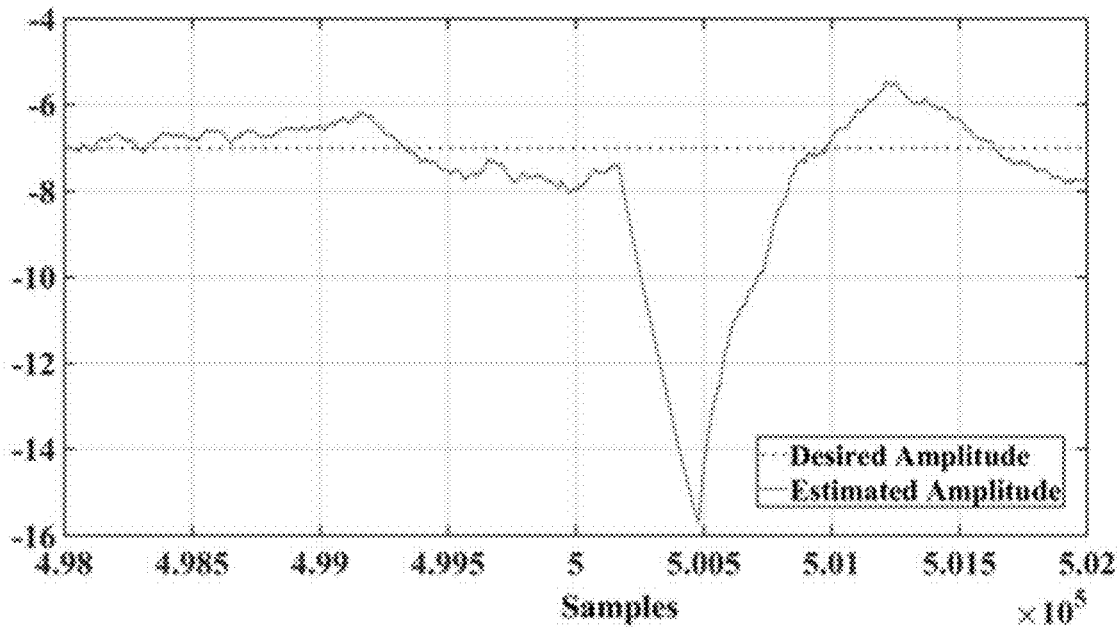
FIG. 6B depicts exemplary schematic of signal amplitudes using AGC when jamming is ended according to various disclosed embodiments of the present disclosure.

FIG. 5 depicts an exemplary schematic of signal amplitudes using SAR-AGC according to various disclosed embodiments of the present disclosure. Using the SAR-AGC, the amplitude may be controlled within a range of tolerant errors, which is shown by FIG. 5. FIG. 6A depicts an exemplary schematic of signal amplitudes using SAR-AGC when jamming is started according to various disclosed embodiments of the present disclosure. FIG. 6B depicts exemplary schematic of signal amplitudes using SAR-AGC when jamming is ended according to various disclosed embodiments of the present disclosure. Moreover, FIGS. 6A-6B may illustrate that the SAR-AGC may take time to respond to the changes of jamming status, as SAR is computed using the blocks of sampled signals and then used to determine whether there is fast response to amplitude fluctuations. Furthermore, using the SAR-AGC may decrease BER from about 0.1471 to about 0.1189. The BER may be further improved by enhancing the control performance using the developed PID-based AGC schedule (e.g., PID-AGC).

Figure 7A:
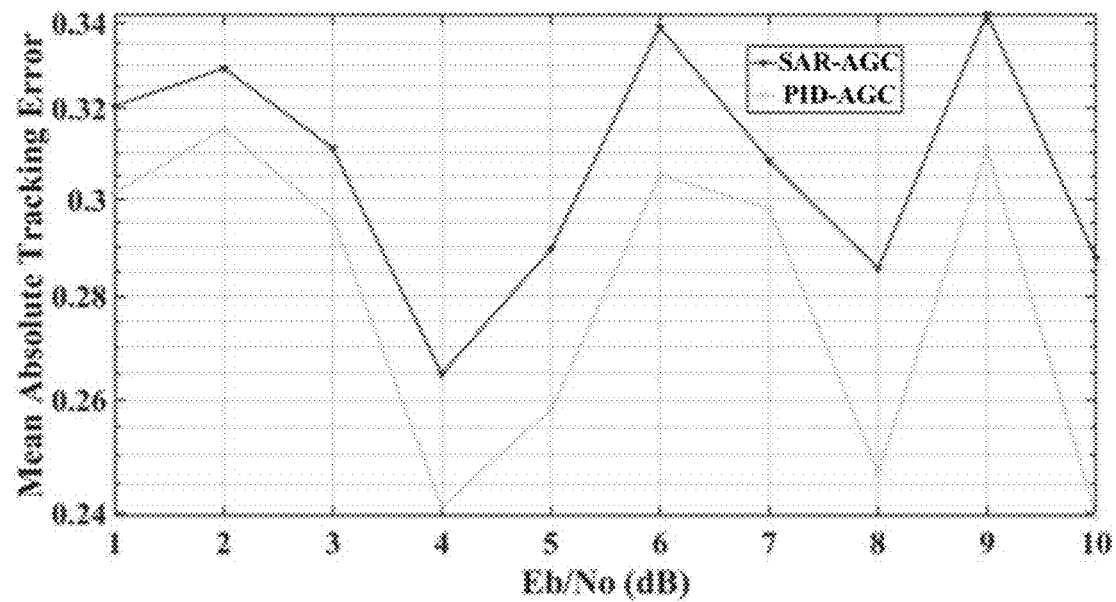
FIG. 7A depicts comparison of average mean absolute tracking errors for different Eb/No's of channel noise according to various disclosed embodiments of the present disclosure.
Figure 7B:
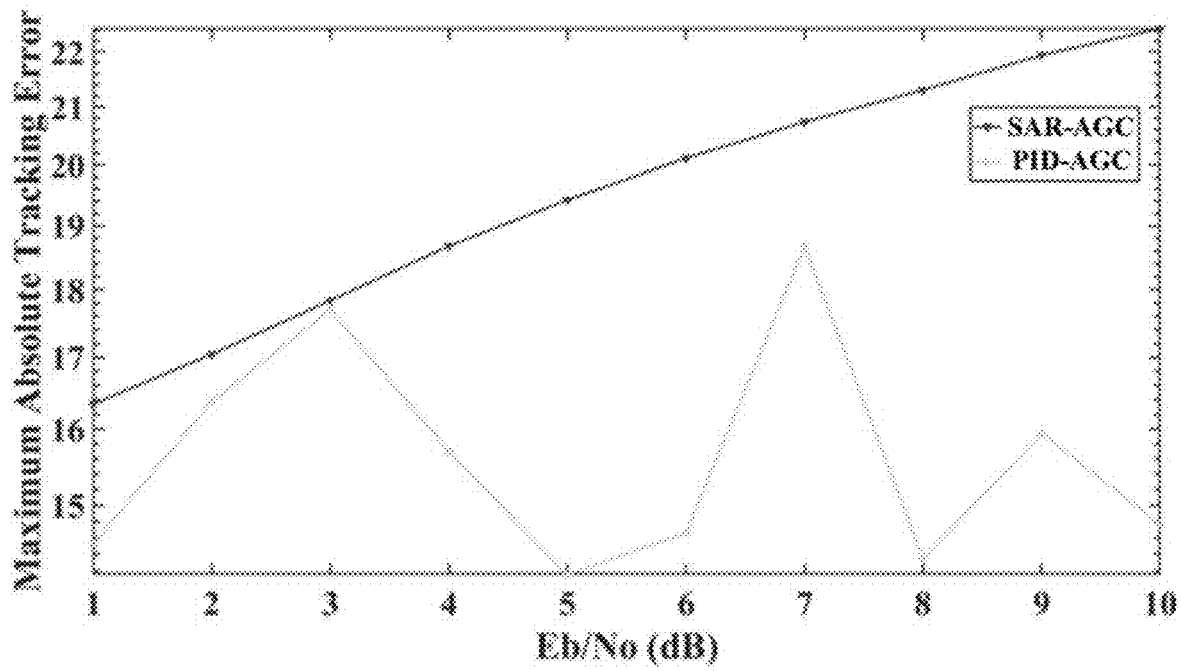
FIG. 7B depicts comparison of average maximum absolute errors for different Eb/No's of channel noise according to various disclosed embodiments of the present disclosure.

FIGS. 7A-7B illustration simulations to compare the PID-AGC and the SAR-AGC scheme. The tuning parameters may be determined by simulations as follows: $\beta^{fast}=2^8$, $\beta^{slow}=2^9$ for PID-AGC while $\beta=2^9$ for the SAR-AGC; $K_P=1e-5$, $K_I=5e-5$, $K_D=100$, $K_{D_i}=1e-1$. Mean absolute error and maximum absolute error may be used to measure the control performance. Furthermore, Monte Carlo studies may be employed to compare AGC schemes under different realizations of noise and jamming when L=9 and $\beta^{slow}=\beta=2^9$. In particular, simulations 100 times may be run under different realization of noise and jamming for each Eb/No of channel noise.

Figure 8A:
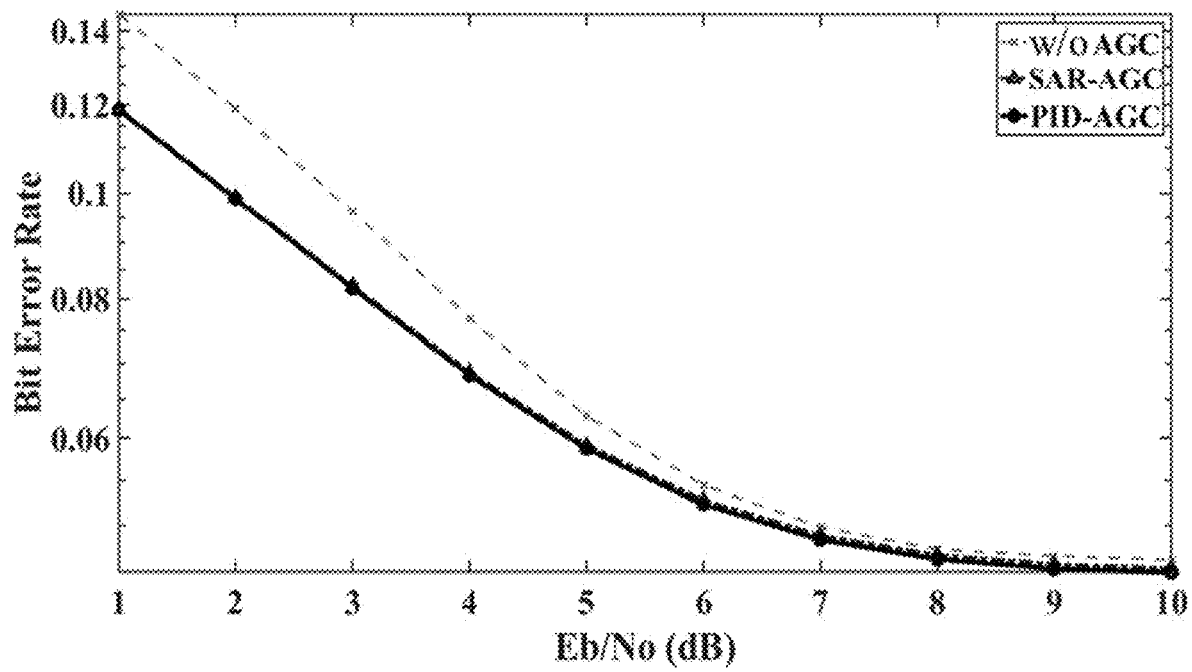
FIG. 8A depicts a schematic of comparison of average bit error rate (BER)'s for different Eb/No's of channel noise according to various disclosed embodiments of the present disclosure.
Figure 8B:
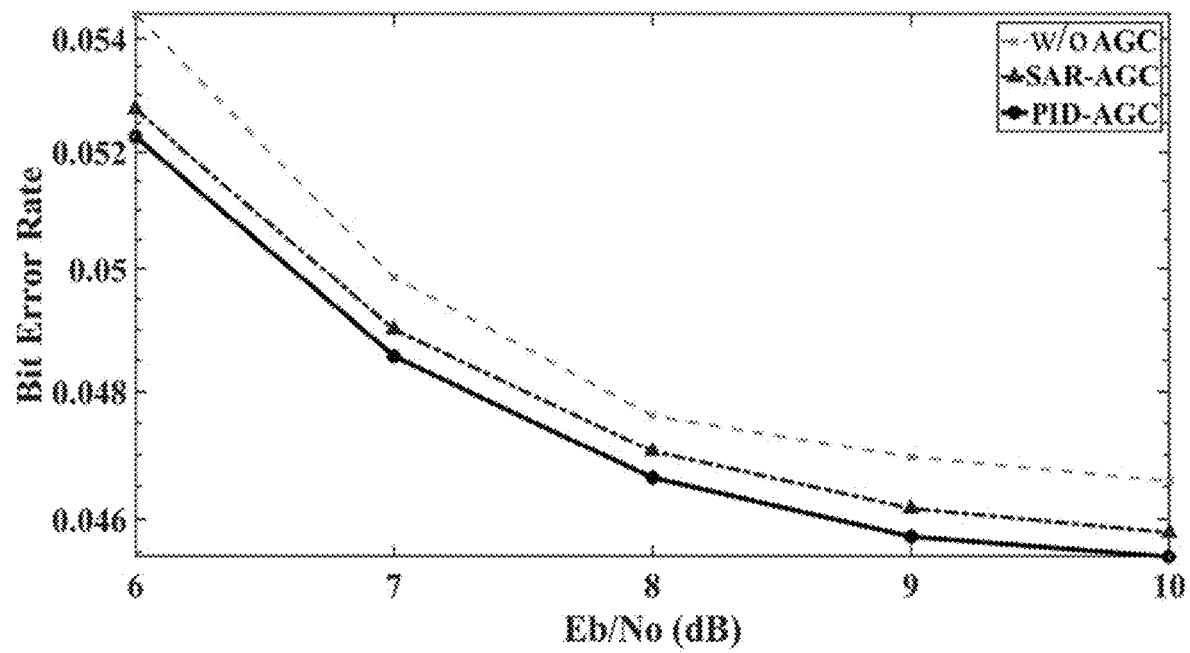
FIG. 8B depicts another schematic of comparison of average BER's for different Eb/No's of channel noise according to various disclosed embodiments of the present disclosure.

FIG. 7A depicts comparison of average mean absolute tracking errors for different Eb/No's of channel noise according to various disclosed embodiments of the present disclosure. FIG. 7B depicts comparison of average maximum absolute errors for different Eb/No's of channel noise according to various disclosed embodiments of the present disclosure. FIGS. 7A-7B illustrate that the developed PID-AGC may achieve smaller mean absolute errors and maximum absolute errors than the SAR-AGC, which may demonstrate that the developed PID-AGC can improve control performance. FIG. 8A depicts a schematic of comparison of average BER's for different Eb/No's of channel noise according to various disclosed embodiments of the present disclosure; and FIG. 8B depicts another schematic of comparison of average BER's for different Eb/No's of channel noise according to various disclosed embodiments of the present disclosure. It should be noted that FIG. 8B illustrates a zoom-in portion of FIG. 8A for Eb/No=6, 7, 8, 9 and 10. Moreover, FIGS. 8A-8B illustrates the comparison of BERs under different Eb/No's of channel noise, and Table 2 presents the values of BERs for clarity. The improvement of BER by the AGC may decrease as the Eb/No increases, and the PID-AGC may achieve smaller BERs than the SAR-AGC. Moreover, the improvement of PID-AGC over the SAR-AGC may slightly increase as Eb/No increases. It should be noted that the improvement of BER by PID-based AGC over the SAR-AGC may not be significant, which suggests that only improving the control performance of AGC may not significantly decrease the BER without anti-jamming.

Table 2 summarizes BERs of AGC schemes for different Eb/No's when L=9, $\beta^{fast}=2^8$, and $\beta^{slow}=\beta=2^9$.

TABLE 2

| Eb/No | 1 | 2 | 3 | 4 | 5 |
|---|---|---|---|---|---|
| HPA w/o AGC | 0.1448 | 0.1190 | 0.0962 | 0.0769 | 0.0629 |
| SAR-AGC + HPA | 0.1191 | 0.0991 | 0.0822 | 0.0688 | 0.0591 |
| PID-AGC + HPA | 0.1188 | 0.0988 | 0.0818 | 0.0684 | 0.0587 |

| Eb/No | 6 | 7 | 8 | 9 | 10 |
|---|---|---|---|---|---|
| HPA w/o AGC | 0.0544 | 0.0499 | 0.0476 | 0.0470 | 0.0466 |
| SAR-AGC + HPA | 0.0527 | 0.0490 | 0.0471 | 0.0462 | 0.0458 |
| PID-AGC + HPA | 0.0523 | 0.0486 | 0.0466 | 0.0457 | 0.0454 |

A PID-based AGC scheme is developed to improve the control performance with respect to maintaining a to-be-applied signal amplitude and thus decrease the BER for satellite communications under AWGN channel noise and jamming. In particular, derivative terms may be added to the SAR technique for anticipatory control by using the derivative of tracking errors as the future trend of the tracking errors, and integral terms may be added to decrease steady-state errors. Moreover, different block sizes may be used to achieve desirable trade-off between fast response and robustness to noise. Simulations on the satellite transponder model demonstrates the developed approach may improve both control performance and BER.

From above-mentioned embodiments, it may be seen that at least following beneficial effects may be achieved in the present disclosure.

The PID-AGC scheme is provided to enhance the control performance of maintaining to-be-applied signal amplitude and thus decrease the BERs for satellite communications under channel noise and AWGN jamming. The machine learning-based automatic parameter tuning approach may be configured for adapting PID parameters for the PID-AGC scheme based on the signal amplitude tracking errors. In particular, the PID-AGC may use the derivative term of signal amplitude tracking errors for anticipatory control without requiring signal models and the integral term of signal amplitude tracking errors to eliminate steady-state errors. Simulations on the satellite transponder model may demonstrate that the PID-AGC may improve the control performance with respect to average signal amplitude tracking errors and overshoot/undershoot and decrease BERs. The automatic gain control performance regarding tracking errors may be improved by considering future trends of signal amplitude rather than only based on the current signal amplitude tracking errors. The performance may be improved without significantly increasing the online computational cost. The PID-AGC may be compatible with existing satellite transponders and automatic gain control without significant adaption costs. The block size may be determined for computing the signal amplitude ratio based on the variations of signal amplitude tracking errors. The PID-AGC design may be easy to be updated by simply updating the tuning parameters (including the coefficients and block sizes) of the PID terms for varying channel noise and jamming conditions.

Various embodiments of the present disclosure provide a system. The system includes a memory, configured to store program instructions for performing a method of PID-based automatic gain control for a satellite transponder system under partial-time partial-band AWGN jamming; and a processor, coupled with the memory and, when executing the program instructions, configured for: receiving a sequence of sample signals by a AGC processor after an analog-digital-converter (ADC) in the satellite transponder system; determining two different block sizes from the sequence of sample signals where a block size of a first block of sample signals is greater than a block size of a second block of sample signals; using the block size of the first block to compute a first signal-amplitude-ratio (SAR)-based gain value and using the block size of the second block to compute a second signal-amplitude-ratio (SAR)-based gain value by the AGC processor through the sequence of sample signals; and if the first SAR-based gain value is greater than an amplitude threshold, calculating a to-be-applied gain control value of an m-th transmitted symbol at a n-th time step using the second SAR-based gain value, a tracking error at a (n−1)-th time step, a summation of a plurality of tracking errors from a 1-st time step to the (n−1)-th time step, and a tracking error difference between the tracking error at the (n−1)-th time step and a tracking error at a (n−2)-th time step; or if the first SAR-based gain value is equal to or less than the amplitude threshold, calculating a to-be-applied gain control value of an m-th transmitted symbol at a n-th time step using a minimum difference between an estimated amplitude and each of reference amplitudes in a lookup table (LUT), and the tracking error difference between the tracking error at a (n−1)-th time step and the tracking error at a (n−2)-th time step.

Various embodiments of the present disclosure provide a non-transitory computer-readable storage medium, containing program instructions for, when being executed by a processor, performing a method of PID-based automatic gain control for a satellite transponder system under partial-time partial-band AWGN jamming. The method includes receiving a sequence of sample signals by a AGC processor after an analog-digital-converter (ADC) in the satellite transponder system; determining two different block sizes from the sequence of sample signals where a block size of a first block of sample signals is greater than a block size of a second block of sample signals; using the block size of the first block to compute a first signal-amplitude-ratio (SAR)-based gain value and using the block size of the second block to compute a second signal-amplitude-ratio (SAR)-based gain value by the AGC processor through the sequence of sample signals; and if the first SAR-based gain value is greater than an amplitude threshold, calculating a to-be-applied gain control value of an m-th transmitted symbol at a n-th time step using the second SAR-based gain value, a tracking error at a (n−1)-th time step, a summation of a plurality of tracking errors from a 1-st time step to the (n−1)-th time step, and a tracking error difference between the tracking error at the (n−1)-th time step and a tracking error at a (n−2)-th time step; or if the first SAR-based gain value is equal to or less than the amplitude threshold, calculating a to-be-applied gain control value of an m-th transmitted symbol at a n-th time step using a minimum difference between an estimated amplitude and each of reference amplitudes in a lookup table (LUT), and the tracking error difference between the tracking error at a (n−1)-th time step and the tracking error at a (n−2)-th time step.

Although some embodiments of the present disclosure have been described in detail through various embodiments, those skilled in the art should understand that above embodiments may be for illustration only and may not be intended to limit the scope of the present disclosure. Those skilled in the art should understood that modifications may be made to above embodiments without departing from the scope and spirit of the present disclosure. The scope of the present disclosure may be defined by the appended claims.

What is claimed is:

1. A method of proportional-integral-derivative (PID) based automatic gain control (AGC) for a satellite transponder system under partial-time partial-band additive white Gaussian noise (AWGN) jamming, comprising:
   receiving a sequence of sample signals by a AGC processor after an analog-digital-converter (ADC) in the satellite transponder system;
   determining two different block sizes from the sequence of sample signals wherein a block size of a first block of sample signals is greater than a block size of a second block of sample signals;
   using the block size of the first block to compute a first signal-amplitude-ratio (SAR)-based gain value and using the block size of the second block to compute a second signal-amplitude-ratio (SAR)-based gain value by the AGC processor through the sequence of sample signals; and
   if the first SAR-based gain value is greater than an amplitude threshold, calculating a to-be-applied gain control value of an m-th transmitted symbol at a n-th time step, m and n are non-zero positive integers, using the second SAR-based gain value, a tracking error at a (n−1)-th time step, a summation of a plurality of tracking errors from a 1-st time step to the (n−1)-th time step, and a tracking error difference between the tracking error at the (n−1)-th time step and a tracking error at a (n−2)-th time step; or
   if the first SAR-based gain value is equal to or less than the amplitude threshold, calculating a to-be-applied gain control value of an m-th transmitted symbol at a n-th time step using a minimum difference between an estimated amplitude and each of reference amplitudes in a lookup table (LUT), and the tracking error difference between the tracking error at a (n−1)-th time step and the tracking error at a (n−2)-th time step.

2. The method according to claim 1, further including:
   calculating a new AGC gain at the n-th time step according to the to-be-applied gain control value at the n-th time step and a corresponding AGC gain at the (n−1)-th time step.

3. The method according to claim 2, wherein:
   if an absolute value of a difference between the first SAR-based gain value and the second SAR-based gain value is equal to or greater than a predefined step size, the second SAR-based gain value is used for computing the to-be-applied gain control value.

4. The method according to claim 2, wherein:
if an absolute value of a difference between the first SAR-based gain value and the second SAR-based gain value is less than a predefined step size, the first SAR-based gain value is used for computing the to-be-applied gain control value.

5. The method according to claim 2, wherein the to-be-applied gain control value is calculated as:

$$S_{m,n} = \begin{cases} S_p^{fast} + K_P \cdot e_{m,n-1} + K_I \cdot \sum_{i=1}^{n-1} e_{m,i} + K_D \cdot \Delta e_{m,n-1}, & \text{if } |S_p^{slow}| > \gamma; \\ S_{i*} + K'_D \cdot \Delta e_{m,n-1}, & \text{otherwise} \end{cases}$$

wherein $S_{m,n}$ denotes the to-be-applied gain control value of the m-th transmitted symbol at the n-th time step, i denotes a reference amplitude, $K_P$ denotes a proportional term, $K_I$ denotes an integral term, $K_D$ and $K'_D$ denote derivative terms, $S_p^{slow}$ denotes the first SAR-based gain value, $S_p^{fast}$ denotes the second SAR-based gain value, e denotes a tracking error, $\Delta e_{m,n-1} = e_{m,n-1} - e_{m,n-2}$, and $S_{i*}$ denotes the minimum difference between the estimated amplitude and each of reference amplitudes in the LUT.

6. The method according to claim 2, wherein:
the first SAR-based gain value and the second SAR-based gain value are calculated through a normalized signal amplitude ratio calculator.

7. A system, comprising:
a memory, configured to store program instructions for performing a method of proportional-integral-derivative (PID) based automatic gain control (AGC) for a satellite transponder system under partial-time partial-band additive white Gaussian noise (AWGN) jamming; and
a processor, coupled with the memory and, when executing the program instructions, configured for:
receiving a sequence of sample signals by a AGC processor after an analog-digital-converter (ADC) in the satellite transponder system;
determining two different block sizes from the sequence of sample signals wherein a block size of a first block of sample signals is greater than a block size of a second block of sample signals;
using the block size of the first block to compute a first signal-amplitude-ratio (SAR)-based gain value and using the block size of the second block to compute a second signal-amplitude-ratio (SAR)-based gain value by the AGC processor through the sequence of sample signals; and
if the first SAR-based gain value is greater than an amplitude threshold, calculating a to-be-applied gain control value of an m-th transmitted symbol at a n-th time step, m and n are non-zero positive integers, using the second SAR-based gain value, a tracking error at a (n−1)-th time step, a summation of a plurality of tracking errors from a 1-st time step to the (n−1)-th time step, and a tracking error difference between the tracking error at the (n−1)-th time step and a tracking error at a (n−2)-th time step; or
if the first SAR-based gain value is equal to or less than the amplitude threshold, calculating a to-be-applied gain control value of an m-th transmitted symbol at a n-th time step using a minimum difference between an estimated amplitude and each of reference amplitudes in a lookup table (LUT), and the tracking error difference between the tracking error at a (n−1)-th time step and the tracking error at a (n−2)-th time step.

8. The system according to claim 7, wherein the processor is further configured to:
calculate a new AGC gain at the n-th time step according to the to-be-applied gain control value at the n-th time step and a corresponding AGC gain at the (n−1)-th time step.

9. The system according to claim 8, wherein:
if an absolute value of a difference between the first SAR-based gain value and the second SAR-based gain value is equal to or greater than a predefined step size, the second SAR-based gain value is used for computing the to-be-applied gain control value.

10. The system according to claim 8, wherein:
if an absolute value of a difference between the first SAR-based gain value and the second SAR-based gain value is less than a predefined step size, the first SAR-based gain value is used for computing the to-be-applied gain control value.

11. The system according to claim 8, wherein the to-be-applied gain control value is calculated as:

$$S_{m,n} = \begin{cases} S_p^{fast} + K_P \cdot e_{m,n-1} + K_I \cdot \sum_{i=1}^{n-1} e_{m,i} + K_D \cdot \Delta e_{m,n-1}, & \text{if } |S_p^{slow}| > \gamma; \\ S_{i*} + K'_D \cdot \Delta e_{m,n-1}, & \text{otherwise} \end{cases}$$

wherein $S_{m,n}$ denotes the to-be-applied gain control value of the m-th transmitted symbol at the n-th time step, i denotes a reference amplitude, $K_P$ denotes a proportional term, $K_I$ denotes an integral term, $K_D$ and $K'_D$ denote derivative terms, $S_p^{slow}$ denotes the first SAR-based gain value, $S_p^{fast}$ denotes the second SAR-based gain value, e denotes a tracking error, $\Delta e_{m,n-1} = e_{m,n-1} - e_{m,n-2}$, and $S_{i*}$ denotes the minimum difference between the estimated amplitude and each of reference amplitudes in the LUT.

12. The system according to claim 8, wherein:
the first SAR-based gain value and the second SAR-based gain value are calculated through a normalized signal amplitude ratio calculator.

13. A non-transitory computer-readable storage medium, containing program instructions for, when being executed by a processor, performing a method of proportional-integral-derivative (PID) based automatic gain control (AGC) for a satellite transponder system under partial-time partial-band additive white Gaussian noise (AWGN) jamming; the method comprising:
receiving a sequence of sample signals by a AGC processor after an analog-digital-converter (ADC) in the satellite transponder system;
determining two different block sizes from the sequence of sample signals wherein a block size of a first block of sample signals is greater than a block size of a second block of sample signals;
using the block size of the first block to compute a first signal-amplitude-ratio (SAR)-based gain value and using the block size of the second block to compute a second signal-amplitude-ratio (SAR)-based gain value by the AGC processor through the sequence of sample signals; and
if the first SAR-based gain value is greater than an amplitude threshold, calculating a to-be-applied gain control value of an m-th transmitted symbol at a n-th time step, m and n are non-zero positive integers, using the second SAR-based gain value, a tracking error at a (n−1)-th time step, a summation of a plurality of tracking errors from a 1-st time step to the (n−1)-th time step, and a tracking error difference between the tracking error at the (n−1)-th time step and a tracking error at a (n−2)-th time step; or if the first SAR-based gain value is equal to or less than the amplitude threshold, calculating a to-be-applied gain control value of an m-th transmitted symbol at a n-th time step using a minimum difference between an estimated amplitude and each of reference amplitudes in a lookup table (LUT), and the tracking error difference between the tracking error at a (n−1)-th time step and the tracking error at a (n−2)-th time step.

14. The storage medium according to claim 13, wherein the processor is further configured to:
calculate a new AGC gain at the n-th time step according to the to-be-applied gain control value at the n-th time step and a corresponding AGC gain at the (n−1)-th time step.

15. The storage medium according to claim 14, wherein:
if an absolute value of a difference between the first SAR-based gain value and the second SAR-based gain value is equal to or greater than a predefined step size, the second SAR-based gain value is used for computing the to-be-applied gain control value.

16. The storage medium according to claim 14, wherein:
if an absolute value of a difference between the first SAR-based gain value and the second SAR-based gain value is less than a predefined step size, the first SAR-based gain value is used for computing the to-be-applied gain control value.

17. The storage medium according to claim 14, wherein the to-be-applied gain control value is calculated as:

$$S_{m,n} = \begin{cases} S_p^{fast} + K_P \cdot e_{m,n-1} + K_I \cdot \sum_{i=1}^{n-1} e_{m,i} + K_D \cdot \Delta e_{m,n-1}, & \text{if } |S_p^{slow}| > \gamma; \\ S_{i^*} + K'_D \cdot \Delta e_{m,n-1}, & \text{otherwise} \end{cases}$$

wherein $S_{m,n}$ denotes the to-be-applied gain control value of the m-th transmitted symbol at the n-th time step, i denotes a reference amplitude, $K_P$ denotes a proportional term, $K_I$ denotes an integral term, $K_D$ and $K'_D$ denote derivative terms, $S_p^{slow}$ denotes the first SAR-based gain value, $S_p^{fast}$ denotes the second SAR-based gain value, e denotes a tracking error, $\Delta e_{m,n-1} = e_{m,n-1} - e_{m,n-2}$, and $S_{i^*}$ denotes the minimum difference between the estimated amplitude and each of reference amplitudes in the LUT.

18. The storage medium according to claim 14, wherein:
the first SAR-based gain value and the second SAR-based gain value are calculated through a normalized signal amplitude ratio calculator.

* * * * *